United States Patent
Fukano

(10) Patent No.: US 9,305,857 B2
(45) Date of Patent: Apr. 5, 2016

(54) COOLING DEVICE, COOLING-CONTROL METHOD, AND STORAGE HAVING PROGRAM STORED THEREON

(75) Inventor: Kazuyasu Fukano, Hachioji (JP)

(73) Assignee: CASIO COMPUTER CO., LTD., Tokyo (JP)

(*) Notice: Subject to any disclaimer, the term of this patent is extended or adjusted under 35 U.S.C. 154(b) by 739 days.

(21) Appl. No.: 13/362,306

(22) Filed: Jan. 31, 2012

(65) Prior Publication Data

US 2012/0197459 A1 Aug. 2, 2012

(30) Foreign Application Priority Data

Feb. 2, 2011 (JP) .................................. 2011-020508

(51) Int. Cl.
*H01L 23/34* (2006.01)
*H01L 23/467* (2006.01)
*H01L 23/38* (2006.01)
(Continued)

(52) U.S. Cl.
CPC ................ *H01L 23/34* (2013.01); *G03B 21/16* (2013.01); *H01L 23/38* (2013.01); *H01L 23/467* (2013.01); *H04N 9/3144* (2013.01); *H04N 9/3194* (2013.01); *H01L 2924/0002* (2013.01)

(58) Field of Classification Search
CPC ..... G05D 23/1917; F25B 21/00; F25B 21/04; F25B 2321/0212; F25B 47/022; F25D 21/008; B01D 5/0042; F24F 2003/1446; H01L 23/34; H01L 23/467; H01L 23/38; G03B 21/16

USPC ................. 700/300; 62/3.1, 3.2, 3.7; 361/700
See application file for complete search history.

(56) References Cited

U.S. PATENT DOCUMENTS

| 7,642,795 B2 * | 1/2010 | Hashimoto ............. 324/750.09 |
| 8,251,513 B2 | 8/2012 | Itsuki et al. |
| 8,369,090 B2 * | 2/2013 | Chester et al. ................ 361/699 |

(Continued)

FOREIGN PATENT DOCUMENTS

| EP | 2 184 639 A2 | 5/2010 |
| EP | 2 256 548 A1 | 12/2010 |

(Continued)

OTHER PUBLICATIONS

Chinese Office Action dated Feb. 8, 2014 (and English translation thereof) in counterpart Chinese Application No. 201210056904.7.

(Continued)

*Primary Examiner* — Carlos Ortiz Rodriguez
*Assistant Examiner* — Jason Lin
(74) *Attorney, Agent, or Firm* — Holtz, Holtz & Volek PC

(57) ABSTRACT

A first cooling unit is provided for an exothermic member and has a capability of cooling the exothermic member to a temperature less than an ambient temperature of the exothermic member by absorbing heat from the exothermic member. A second cooling unit has a capability of cooling the exothermic member by blowing air onto the exothermic member. A temperature of the exothermic member is detected. It is determined that whether or not the exothermic member is in a supercooled state based on a detection result. The cooling capability of the first cooling unit is decreased and the cooling capability of the second cooling unit is increased, when the exothermic member is in the supercooled state.

9 Claims, 3 Drawing Sheets

(51) Int. Cl.
*H04N 9/31* (2006.01)
*G03B 21/16* (2006.01)

(56) References Cited

U.S. PATENT DOCUMENTS

| | | | |
|---|---|---|---|
| 8,416,571 B2* | 4/2013 | Mizumura et al. | 361/695 |
| 8,689,569 B2* | 4/2014 | Uratani et al. | 62/3.2 |
| 2002/0162829 A1* | 11/2002 | Weber et al. | 219/209 |
| 2004/0008326 A1* | 1/2004 | Koide | 353/99 |
| 2004/0050076 A1* | 3/2004 | Palfy et al. | 62/155 |
| 2005/0039465 A1* | 2/2005 | Welch | 62/3.7 |
| 2005/0078451 A1* | 4/2005 | Sauciuc et al. | 361/700 |
| 2005/0280994 A1* | 12/2005 | Yazawa | 361/699 |
| 2007/0197885 A1* | 8/2007 | Mah et al. | 600/310 |
| 2009/0016408 A1* | 1/2009 | Doan | G01K 3/005 374/164 |
| 2011/0019160 A1 | 1/2011 | Kitano et al. | |
| 2011/0037954 A1 | 2/2011 | Tsuchiya et al. | |
| 2011/0138395 A1* | 6/2011 | Wolfe | 718/105 |
| 2011/0277967 A1* | 11/2011 | Fried et al. | 165/104.26 |
| 2012/0197459 A1 | 8/2012 | Fukano | |

FOREIGN PATENT DOCUMENTS

| | | |
|---|---|---|
| JP | 08211959 A | 8/1996 |
| JP | 9-307030 A | 11/1997 |
| JP | 2005-333342 A | 12/2005 |
| JP | 2006043272 A | 2/2006 |
| JP | 2007-157770 A | 6/2007 |
| JP | 2008011233 A | 1/2008 |
| JP | 2009-258670 A | 11/2009 |
| JP | 2010107631 A | 5/2010 |
| JP | 5206814 B2 | 6/2013 |

OTHER PUBLICATIONS

Japanese Office Action dated Oct. 21, 2014, issued in counterpart Japanese Application No. 2013-030505.

* cited by examiner

COOLING DEVICE, COOLING-CONTROL METHOD, AND STORAGE HAVING PROGRAM STORED THEREON

CROSS-REFERENCE TO RELATED APPLICATIONS

This application is based upon and claims the benefit of priority from prior Japanese Patent Application No. 2011-020508, filed Feb. 2, 2011, the entire contents of which are incorporated herein by reference.

BACKGROUND OF THE INVENTION

1. Field of the Invention

The present invention relates to a cooling device, a cooling-control method, and a storage medium having program stored thereon, suitable for a projector or the like in which a semiconductor light-emitting element is cooled by using, for example, a Peltier element.

2. Description of the Related Art

A technique configured to cool a CPU or the like by using a cooling device utilizing the Peltier effect, and arranged thereon has been contrived. (e.g., Jpn. Pat. Appln. KOKAI Publication No. 09-307030)

A Peltier element is used to forcibly cool an exothermic member by absorbing heat from the exothermic member as an object to be cooled and, unlike the air cooling system configured to carry out heat exchange between the exothermic member and external air by using a cooling fan, it is capable of cooling (has the capability of cooling) the exothermic member to a temperature less than the temperature of the external air.

Accordingly, when the exothermic member is cooled to a temperature less than a dew point determined by the temperature and humidity of the atmosphere around the exothermic member, condensation forms on the exothermic member and, consequently, there is the possibility of electronic components or the like constituting the exothermic member being damaged.

Techniques including the technique described in above-mentioned Jpn. Pat. Appln. KOKAI Publication No. 09-307030, configured to prevent condensation forming on an exothermic member as an object to be cooled by adjusting a cooling operation to be carried out by a Peltier element are variously contrived.

However, by using a method in which the degree of cooling to be carried out by a Peltier element is simply controlled such that the temperature does not reach the dew point, the required cooling state cannot be maintained consequently, and thus it is even conceivable that, if the exothermic member which is the object to be cooled is, for example, a CPU, reduction of the operation speed or thermal runaway will be caused.

Therefore, it is difficult, to operate the exothermic member while keeping the member in an appropriate state.

BRIEF SUMMARY OF THE INVENTION

Accordingly, it is an object of the invention to provide a projection apparatus, projection method, and a storage medium having program stored thereon, capable of appropriately maintaining the operation performance of an exothermic member, and preventing condensation or the like due to supercooling.

According to one aspect of the present invention, there is provided a cooling device configured to cool an exothermic member as an object to be cooled, comprising: a first cooling unit provided for the exothermic member, and having a capability of cooling the exothermic member to a temperature less than an ambient temperature of the exothermic member by absorbing heat from the exothermic member; a second cooling unit having a capability of cooling the exothermic member by blowing air onto the exothermic member; a first temperature detection unit configured to detect a temperature of the exothermic member; a determination unit configured to determine whether or not the exothermic member is in a supercooled state on the basis of a detection result obtained by the first temperature detection unit; and a cooling control unit configured to decrease the cooling capability of the first cooling unit, and increase the cooling capability of the second cooling unit, when the determination unit determines that the exothermic member is in the supercooled state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Hereinafter, an embodiment of a case where the present invention is applied to a data projector apparatus of the digital light processing (DLP) (registered trade name) system will be described with reference to the drawings.

Figure 1:
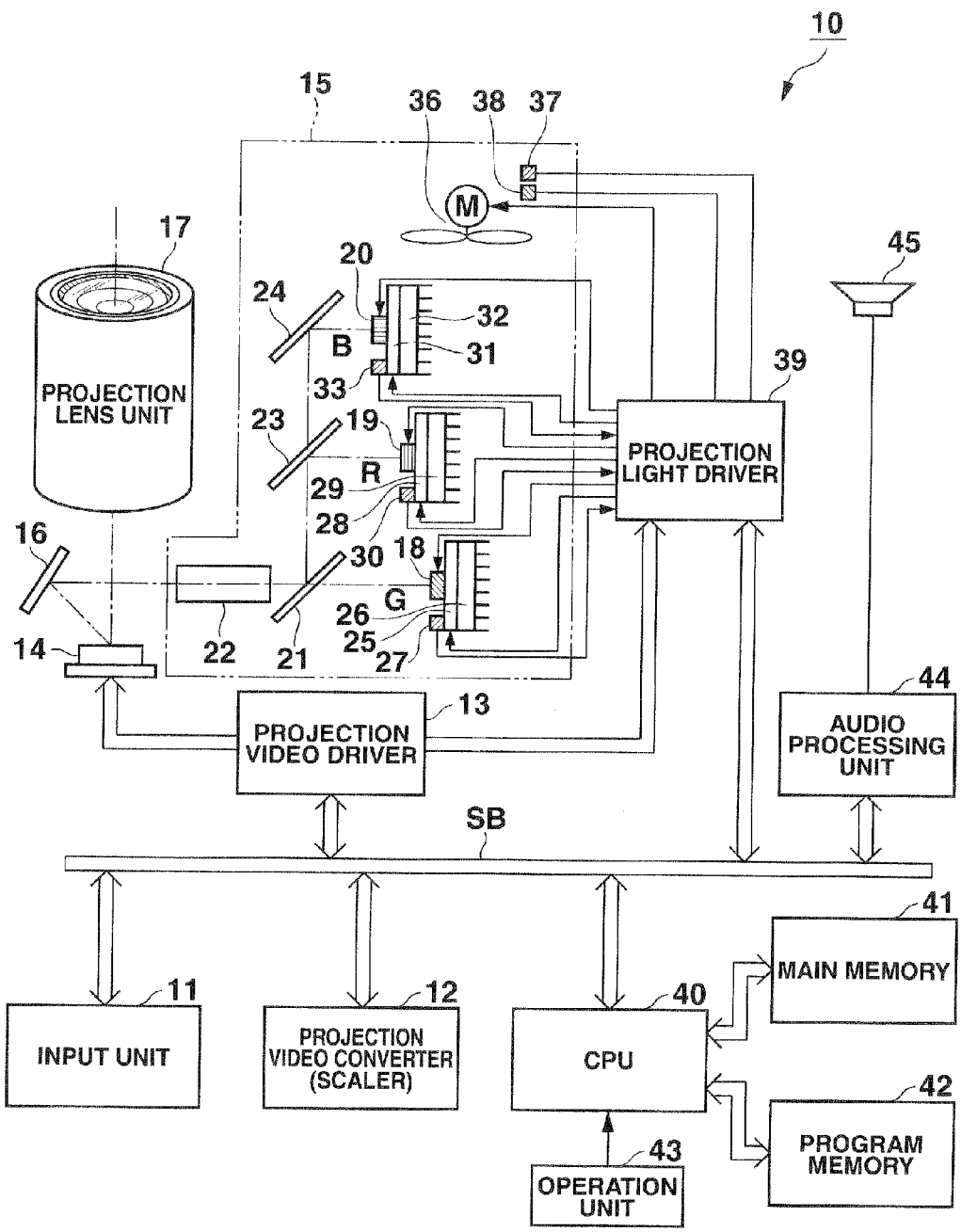
FIG. 1 is a block diagram showing the functional circuit configuration of a data projector apparatus according an embodiment of the present invention.

FIG. 1 is a diagram for mainly explaining the functional configuration of an electronic circuit of a data projector apparatus 10 according this embodiment.

In FIG. 1, a reference symbol 11 denotes an input unit.

This input unit 11 includes a video input terminal of the pin-jack (RCA) type, RGB input terminal of the D-sub 15 type, video/audio input terminal of the High-Definition Multimedia Interface (HDMI) standard, and Universal Serial Bus (USB) connector, and a video signal and audio signal are input from a wireline-connected external device through one of these terminals.

Each of video signals of various standards input from the input unit 11 is input to a projection video converter 12 also called a scaler through a system bus SB.

The projection video converter 12 unifies the input video signals into video signals of a predetermined format suitable for projection, appropriately writes the video signals to an incorporated buffer memory for display, and thereafter reads the written video signals to send them to a projection video driver 13.

The projection video driver 13 display-drives a micromirror element 14 by higher-speed time-division drive obtained by multiplication of a frame rate conforming to a predetermined format (for example, 60 frames/sec), division number of color components, and display gradation-step number according to the video signal sent thereto.

This micromirror element 14 on/off-operates an inclination angle of each of a plurality of, for example, WXGA (1280 pixels×768 pixels) micromirrors arranged in an array form at high speed to carry out a display operation, thereby forming a light figure by the reflection light of the micromirrors.

On the other hand, primary color light components of R, G, and B are emitted cyclically by time division from a light source section 15.

The primary color light components from the light source section 15 are subjected to total reflection by a mirror 16 to irradiate the above-mentioned micromirror element 14.

Further, a light figure is formed by the reflection light from the micromirror element 14, and the formed light figure is projection-displayed on a screen (not shown) which is the projection object through a projection lens unit 17.

The light source section 15 described above includes a laser diode (hereinafter referred to as a "G-LD") 18 configured to emit green (G) light, light-emitting diode (hereinafter referred to as an "R-LED") 19 configured to emit red (R) light, and laser diode (hereinafter referred to as a "B-LD") 20 configured to emit blue (B) light.

The green light emitted from the G-LD 18 passes through a dichroic mirror 21, is formed into a light flux having approximately uniform luminance distribution by an integrator 22, and thereafter travels toward the mirror 16 described above.

The red light emitted from the R-LED 19 is reflected from a dichroic mirror 23, is thereafter reflected also from the dichroic mirror 21 described above, is formed into a light flux having approximately uniform luminance distribution by the integrator 22, and thereafter travels toward the mirror 16 described above.

The blue light emitted from the B-LD 20 is reflected from a mirror 24, thereafter passes through the dichroic mirror 23 described above, is thereafter reflected from the dichroic mirror 21 described above, is formed into a light flux having approximately uniform luminance distribution by the integrator 22, and thereafter travels toward the mirror 16 described above.

The dichroic mirror 21 described above passes the green light therethrough, whereas the mirror 21 reflects the red light and blue light.

The dichroic mirror 23 described above reflects the red light, whereas the mirror 23 passes the blue light therethrough.

The G-LD 18 described above is formed integral, on a substrate 25, with a Peltier element 26 serving as a thermoelectric element configured to carry out cooling by the Peltier effect.

In the vicinity of the G-LD 18 on the substrate 25, a temperature sensor 27 configured to detect the temperature of the G-LD 18 which is an exothermic member is also arranged.

Likewise, the R-LED 19 is formed integral with a Peltier element 29 on a substrate 28.

In the vicinity of the R-LED 19 on the substrate 28, a temperature sensor 30 is also arranged.

Likewise, the B-LD 20 is formed integral with a Peltier element 32 on a substrate 31.

In the vicinity of the B-LD 20 on the substrate 31, a temperature sensor 33 is also arranged.

Figure 2:
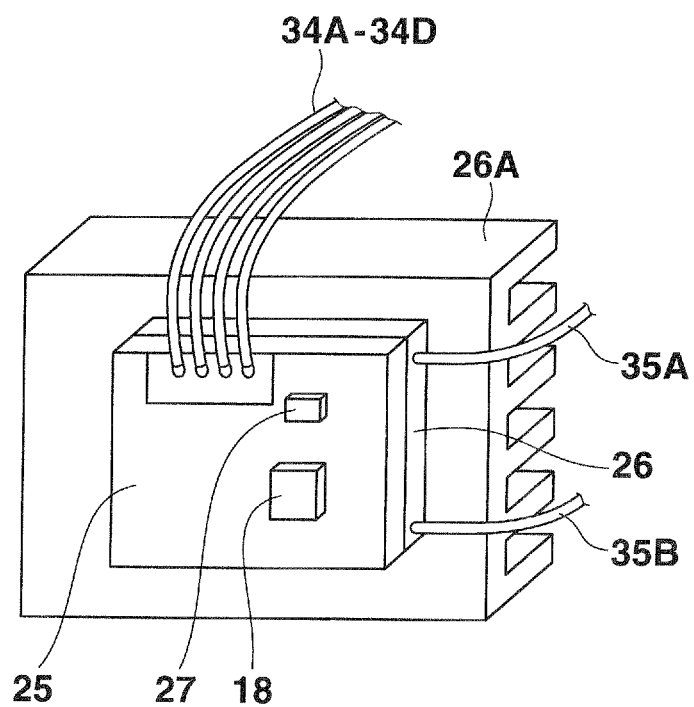
FIG. 2 is a perspective view showing a structural example of the periphery of a light-source element and cooling element (Peltier element) according to the embodiment.

FIG. 2 is a perspective view showing the configuration of each of the G-LD 18, R-LED 19, and B-LD 20, and a peripheral part of each of them by taking the G-LD 18 and the peripheral part thereof as an example.

On the substrate 25 having high thermal conductivity, the G-LD 18 and the temperature sensor 27 are arranged close to each other.

The substrate 25 and the Peltier element 26 are formed integral with each other such that the endothermic surface of the Peltier element 26 is joined to the surface of the substrate 25 on which the C-LD 18 and the temperature sensor 27 are not provided.

Furthermore, on the heat radiating surface side of the Peltier element 26, a heat sink 26A including radiation fins configured to enhance the heat radiation effect is provided.

In total four lead wires 34A to 34D for the G-LD 18 and temperature sensor 27 are connected to the substrate, while in total two lead wires 35A and 35B are connected to the Peltier element 26.

In FIG. 1, a cooling fan 36 configured to promote heat radiation at each of the Peltier elements 26, 29, and 32, and consequently cool the G-LD 18, R-LED 19, and B-LD 20 which are the light source elements is provided.

This cooling fan 36 introduces the air (external air) outside the housing (not shown) of the data projector apparatus 10 into the inside of the housing, promotes heat exchange on the heat radiating surface of each of the Peltier elements 26, 29, and 32, and discharges the heated air outside the housing, thereby cooling the G-LD 18, R-LED 19, and B-LD 20 which serve as the light source.

A temperature sensor 37 and humidity sensor 38 are arranged at an aperture part through which air is introduced by the cooling fan 36 from outside the housing.

The temperature sensor 37 detects the temperature of the air introduced by the cooling fan 36 into the inside of the housing of the data projector apparatus 10.

The humidity sensor 38 detects the humidity of the air introduced by the cooling fan 36 into the inside of the housing of the data projector apparatus 10.

Furthermore, projection light driver 39 controls all the operations of the light-emission drive of the G-LD 18, R-LED 19, and B-LD 20 of the light source section 15, cooling operations to be carried out by the Peltier elements 26, 29, and 32, temperature detection of the temperature sensors 27, 30, and 33, generation of the cooling wind to be carried out by the cooling fan 36, temperature detection of the temperature sensor 37, and humidity detection of the humidity sensor 38 in an integrating manner.

The projection light driver 39 executes the light-emission operations of the G-LD 18, R-LED 19, and B-LD 20, and cooling operations for the G-LD 18, R-LED 19, and B-LD 20 which are the exothermic members in accordance with a timing signal synchronized with an video signal to be supplied from the projection video driver 13, and further in accordance with control carried out by a CPU 40 to be described later.

The CPU 40 controls all the operations of the circuits described above.

This CPU 40 is directly connected to a main memory 41 and program memory 42.

The main memory 41 is constituted of, for example, an SRAM, and functions as a working memory of the CPU 40.

The program memory 42 is constituted of an electrically rewritable nonvolatile memory, such as a flash ROM, and stores therein an operation program to be executed by the CPU 40, and various standardized data items or the like.

The CPU 40 reads the operation program and standardized data items stored in the program memory 42, spreads and stores the read program and data items in the main memory 41, and thereafter executes the program, thereby controlling the data projector apparatus 10 in an integrating manner.

The CPU 40 executes various projection operations in accordance with key operation signals from an operation unit 43.

The operation unit 43 includes a remote control light receiving section configured to receive an infrared modulation signal from a remote controller (not shown) exclusively used for the data projector apparatus 10, and key input unit provided on, for example, the top surface of the housing of the data projector apparatus 10.

The operation unit 43 outputs a key operation signal based on a key of the remote controller exclusively used for the data projector apparatus 10 or the key input unit of the main body operated by the user to the CPU 40.

The CPU 40 is further connected to an audio processing unit 44 through the system bus SB.

The audio processing unit 44 is provided with an audio source circuit such as a PCM audio source or the like, changes an audio signal to be given at the time of a projection operation into the analog form, and drives a speaker section 45 to cause the section 45 to output audio or generates, as the need arises, a beep sound or the like.

Next, operations of the above embodiment will be described below.

Figure 3:
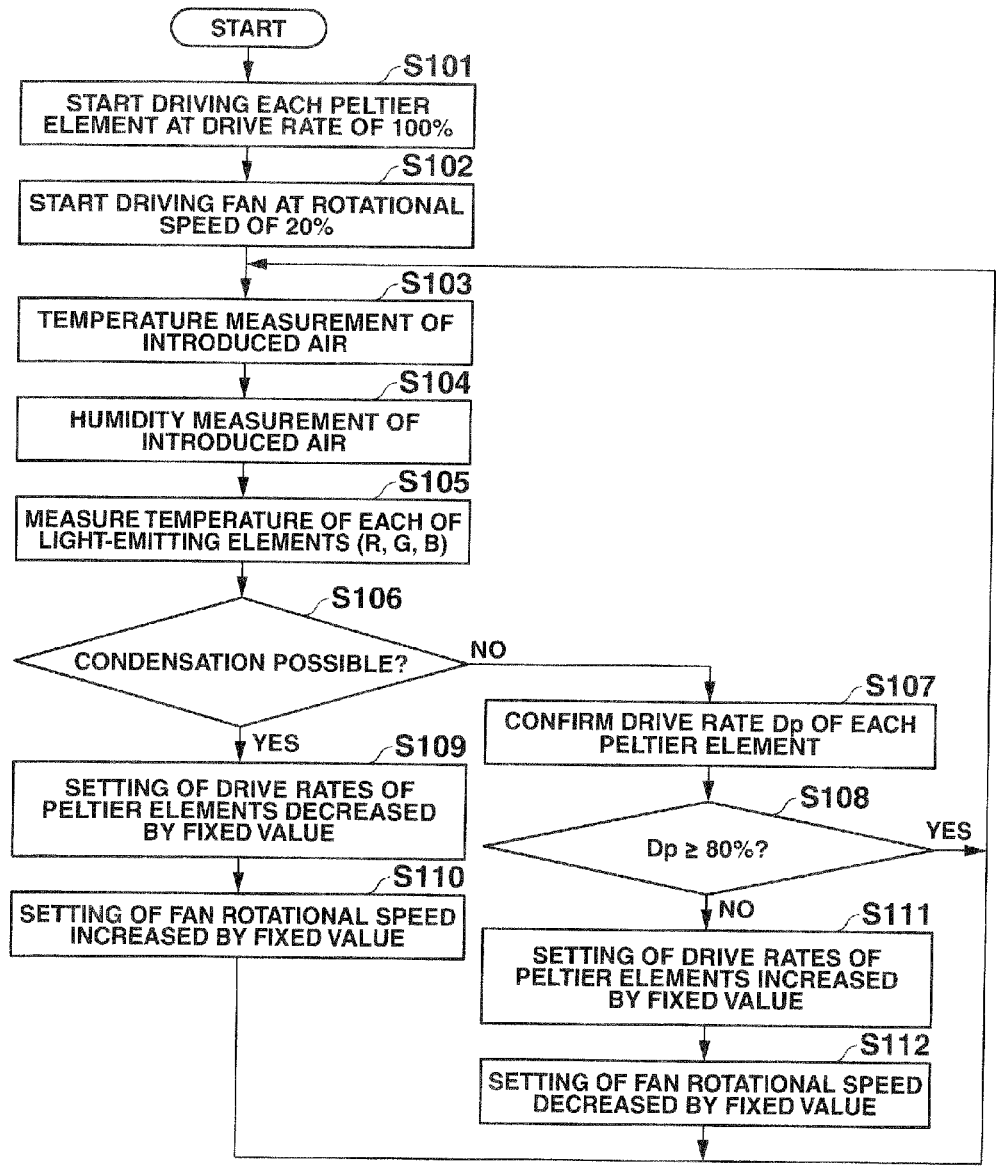
FIG. 3 is a flowchart showing the contents of cooling processing of a light-source section according to the embodiment.

FIG. 3 is a flowchart showing the processing contents of the cooling operation mainly for each of the Peltier elements 26, 29, and 32 of the light source section 15, the processing contents being extracted from the projection operations to be executed by the CPU 40 after the power of the data projector apparatus 10 is turned on.

As described above, also the processing contents shown in FIG. 3 are realized by the CPU 40 by reading the operation program and the like from the program memory 42, spreading and storing the read program and the like in the main memory 41, and thereafter executing the program.

At the beginning of the processing, the CPU 40 causes the projection light driver 39 to start processing of driving each of all of the Peltier element 26 configured to cool the G-LD 18, Peltier element 29 configured to cool the R-LED 19, and Peltier element 32 configured to cool the B-LD 20 at a drive rate of 100% of the rating (step S101).

In addition to the above processing, the CPU 40 causes the projection light driver 39 to start processing of driving the cooling fan 36 at a rotational speed of 20% of the rating (step S102).

Next, the CPU 40 causes, through the projection light driver 39, the temperature sensor 37 and humidity sensor 38 to detect the temperature and humidity of the air to be introduced by the drive of the cooling fan 36 into the inside of the housing of the data projector apparatus 10 (steps S103 and S104).

In addition to the above, the CPU 40 causes, through the projection light driver 39, the temperature sensor 27, temperature sensor 30, and temperature sensor 33 to detect the temperatures of the G-LD 18, LED 19, and B-LD 20, respectively (step S105).

The dew point is univocally determined by the detected temperature and humidity of the air.

Accordingly, the CPU 40 determines, by using the dew point specified by the temperature and humidity of the external air as the criterion, whether or not at least one of the temperatures of the LD 18, LD 20, and LED 19 which are the exothermic members detected by the temperature sensors 27, 33, and 30 is less than the dew point, i.e., whether or not there is the possibility of at least one of the LD 18, LD 20, and LED 19 causing condensation or being in the supercooled state.

More specifically, the CPU 40 uses the lowest one of the temperatures of the LD 18, LD 20, and LED 19 as the representative value, thereby determining whether or not there is a possibility of condensation forming (step S106).

Regarding the specifying procedure of the dew point, the dew point may be specified by using a table previously storing each value of dew point determined by the temperature and humidity of the external air in the program memory 42 as a look-up table or may be calculated by using a computing equation for dew point calculation which is previously incorporated in the operation program, and in which the temperature and humidity of the external air are used as variables.

In step S106 described above, when the temperature of each of the LD 18, LD 20, and LED 19 is higher than the dew point, and when it is determined that there is no possibility of condensation forming, the CPU 40 subsequently confirms the drive rate Dp of each of the Peltier elements 26, 29, and 32 at that point of time (step S107).

Further, the CPU 40 determines whether or not the drive rate Dp is greater than or equal to a value considered to be a sufficiently high value, for example, 80% (step S108).

Here, when it can be determined that the drive rate of each Peltier element is sufficiently high as described above, it is determined that cooling of the exothermic members carried out by the Peltier elements operating silently is efficiently executed, and hence that the rotational speed of the cooling fan 36 which is possibly a source of noise is kept to a minimum, then the flow is returned to the processing from step S103 described above again without changing the control state of the Peltier elements and cooling fan 36, and the same processing is repeated.

Further, in step S106 described above, when the temperature of at least one of the LD 18, LD 20, and LED 19 is less than the dew point, and when it is determined that there is a possibility of condensation due to supercooling, the CPU 40 carries out setting through the projection light driver 39 such that the drive rates Dp of the Peltier elements 26, 29, and 32 set at that point of time are equally decreased by a fixed value, e.g., a value corresponding to 10% of the rating (the cooling capacity is decreased) (step S109).

In addition to the above, the CPU 40 carries out setting through the projection light, driver 39 such that the rotational speed of the cooling fan 36 set at that point of rime is increased by a fixed value, e.g., a value corresponding to 20% of the rating in order to compensate for the decreased setting of the drive rates of the Peltier elements 26, 29, and 32 (the cooling capacity is increased) (step S110), thereafter the flow is returned to the processing from step S103 described above again, and the same processing is repeated.

As described above, the CPU 40 increases the rotational speed of the cooling fan 36 which has been kept low before that time by a corresponding value (the cooling capacity is increased) in order to compensate for the reduction of the overall cooling capacity while preventing condensation due to supercooling based on the drive of the Peltier elements 26, 29, and 32 from occurring.

By carrying out the above operation, it is possible for the CPU 40 to effectively cool the LD 18, LD 20, and LED 19 which are the exothermic members within the hare limit at which no condensation forms, and to keep the noise produced by the cooling fan 36 to a minimum while maintaining high luminous efficiency.

Further, in step S108 described above, when although there is no possibility of condensation, and when it is determined that the drive rates Dp of the Peltier elements are lower than a value considered to be a sufficiently high value, for example, 80%, the CPU 40 considers that although the cooling capacity of the entire apparatus at that point of time is adequately sufficient, the drive rates of the Peltier elements are low, and carries out setting through the projection light driver 39 such that the drive rates Dp of the Peltier elements 26, 29, and 32 set at that point of time are equally increased by a fixed value, e.g., a value corresponding to 10% of the rating (the cooling capacity is increased) (step S111).

In addition to the above, the CPU 40 carries out setting through the projection light driver 39 concomitantly with the increased setting of the drive rates of the Peltier elements 26, 29, and 32 such that the rotational speed of the cooling fan 36 set at that point of time is decreased by a fixed value, e.g., a value corresponding to 20% of the rating (the cooling capacity is decreased) (step S112), thereafter the flow is returned to the processing from step S103 described above again, and the same processing is repeated.

As described above, when there is no possibility of condensation to the LD 18, LD 20, and LED 19 due to supercooling based on the drive of the Peltier elements 26, 29, and 32, the CPU 40 carries out setting such that the drive rates of the Peltier elements are increased (the cooling capacity is increased), thereby decreasing the rotational speed of the cooling fan 36 to the utmost (the cooling capacity is decreased).

By carrying out the above operation, it is possible for the CPU 40 to keep the noise produced by the cooling fan 36 to a minimum while efficiently cooling the LD 18, LD 20, and LED 19 which are the exothermic members by means of the Peltier elements 26, 29, and 32 operating silently.

As described above in detail, according to this embodiment, the temperature of each of the LD 18, LD 20, and LED 19 which are the exothermic members is detected, and control is carried out while appropriately balancing the cooling methods of the two systems, i.e., the endothermic phenomenon and ventilation with each other, whereby it becomes possible to appropriately maintain the operation performance, and prevent condensation due to supercooling.

Furthermore, in the embodiment described above, it is possible to appropriately and exactly acquire the amount of water vapor contained in the introduced air by detecting the humidity of the air to be introduced into the housing of the data projector apparatus 10 by means of the humidity sensor 38, and hence it is further possible to select a more suitable cooling method.

Particularly in the embodiment described above, the dew point is specified from the temperature and humidity of the air to be introduced into the housing of the data projector apparatus 10, and it is determined on the basis the specified dew point, and temperature of the exothermic member as an object to be cooled whether or not there is a possibility of condensation due to supercooling, and hence it is possible to avoid condensation with a high degree of accuracy.

Accordingly, the above-mentioned cooling method is suitable particularly for the case where the object to be controlled is a light-emitting element such as a semiconductor light-emitting element luminous efficiency of which is enhanced when the temperature is kept lower.

It should be noted that in the above embodiment, although the case where a Peltier element is used as an element configured to cool the exothermic member by absorbing heat from the member has been described, the present invention is not limited to this, and other thermoelectric elements such as an element utilizing the Thomson effect may also be employed.

Furthermore, the cooling device is not limited to the thermoelectric element, and it is possible to realize the same silent operation as the above embodiment if any cooling means operating silently without producing noise (less noisy than the cooling fan) such as an absorption-type refrigerator using ammonia or the like as the refrigerant is employed.

Further, in the above embodiment, it is considered that a plurality of exothermic members which are objects to be controlled are present, and it determined whether or not there is the possibility of at least one of the plurality of exothermic members causing condensation, more specifically, the lowest temperature among the temperatures of the plurality of exothermic members is determined as the representative value to be controlled, and hence it is possible to securely carry out control such that none of the exothermic members causes condensation even by simplifying the determination processing.

It should be noted that although not described in the above embodiment, when it is possible to limit the temperature environment and humidity environment of the apparatus which is the object to be controlled to a certain degree, the configuration of the temperature sensor 37 and humidity sensor 38 may be omitted, and only the temperatures of the exothermic members may be detected without detecting the temperature and humidity of the air outside the housing of the apparatus, and cooling of the two systems may be controlled on the basis of the assumed temperature of the outside air and the temperatures detected at the exothermic members.

By carrying out control in the manner described above, it is possible to further simplify the configuration of the apparatus, reduce the manufacturing cost of the apparatus, and reduce the burden of the processing to be carried out by the CPU 40.

Further, only the configuration of the humidity sensor 38 may be omitted, and cooling of the two systems may be controlled on the basis of the temperatures of the exothermic members and ambient temperature of the apparatus without detecting the humidity of the air outside the housing of the apparatus.

In this case, it is sufficient if it is determined that the exothermic member is in the supercooled state when the temperature of the exothermic member is less than the temperature of the air outside the housing by more than a temperature width (for example, 2° C.) previously set by taking the safety factor for condensation into consideration.

By carrying out control in the manner described above, it is possible, when the humidity environment of the apparatus can be limited to a certain degree, to avoid condensating in a simplified manner appropriate for the humidity environment.

Further, although not described in the above embodiment, in consideration of the fact that there is actually a time delay before the effect of the cooling operation of the Peltier element 26 appears at, for example, the G-LD 18, the time-series changes of the detected temperature, and temperature of the exothermic member after an elapse of a fixed time from a drive state of the cooling element may be predicted without carrying out real-time control based on the detected temperature, and cooling control may be executed on the basis of the prediction result.

By carrying out control in the manner described above, it is possible to avoid condensation due to supercooling of the exothermic member which is the object to be controlled more securely.

It should be noted that in the above embodiment, the case where the cooling fan 36 introduces air (external air) outside the housing into the housing to cool the exothermic members, and the temperature sensor 37 and humidity sensor 38 are arranged at an aperture part through which air is introduced by the cooling fan 36 from outside the housing has been described.

However, it is sufficient if the temperature and humidity around the exothermic members can be found by the temperature sensor 37 and humidity sensor 38, and hence the positions of the temperature sensor 37 and humidity sensor 38 are not to be strictly limited.

It should be noted that in the above embodiment, although the case where the embodiment is applied to a data projector apparatus of the DLP (registered trade name) system in which the LDs, and LED that are exothermic members are used as the light source has been described, the present invention is not intended to limit the specific configuration of the exothermic members, and apparatus.

Besides, the present invention is not limited to the above-mentioned embodiment, and can be variously modified in the implementation stage within the scope not deviating from the gist of the invention.

Further, the functions executed in the above-mentioned embodiment may be implemented by combining them with each other as appropriately as possible.

Various stages are included in the above-mentioned embodiment, and various inventions can be extracted by appropriate combination of a plurality of disclosed constituent elements.

For example, even when some constituent elements are deleted from all the constituent elements shown in the embodiment, if an advantage can be obtained, the constitution obtained after deletion of the constituent elements can be extracted as an invention.

Additional advantages and modifications will readily occur to those skilled in the art. Therefore, the invention in its broader aspects is not limited to the specific details and representative embodiments a shown and described herein. Accordingly, various modifications may be made without departing from the spirit or scope of the general inventive concept as defined by the appended claims and their equivalents.

What is claimed is:

1. A cooling device configured to cool an apparatus including a plurality of exothermic members comprising:
    a plurality of thermoelectric elements or a plurality of absorption-type refrigerators provided for the plurality of exothermic members, and having a capability of cooling each of the plurality of the exothermic members by absorbing heat from the plurality of exothermic members;
    a fan having a capability of cooling the plurality of exothermic members by blowing air onto the plurality of exothermic members;
    a plurality of temperature sensors to detect a temperature of each of the plurality of exothermic members; and
    a controller that controls the cooling device, the controller being configured to:
    (i) determine whether the apparatus is in a first state that does not cause condensation, or in a second state that causes condensation, based on a lowest temperature among the temperature detected by the plurality of temperature sensors, (ii) decrease the cooling capability of the plurality of thermoelectric elements or the plurality of absorption-type refrigerators, and increase the cooling capability of the fan, when it is determined that the apparatus is in the second state that causes condensation, and (iii) increase the cooling capability of the plurality of thermoelectric elements or the plurality of absorption-type refrigerators, and decrease the cooling capability of the fan, when it is determined that the apparatus is in the first state that does not cause condensation.

2. The cooling device according to claim 1, further comprising a temperature sensor configured to detect a temperature of the air blown by the fan onto the plurality of exothermic members, wherein the controller is configured to determine whether the apparatus is in the first state or the second state based on the temperatures of the plurality of exothermic members detected by the plurality of temperature sensors, and the temperature of the air detected by the temperature sensor configured to detect the temperature of the air blown by the fan.

3. The cooling device according to claim 2, wherein the controller is configured to determine that the apparatus is in the second state that when the lowest temperature among the temperatures detected by the plurality of temperature sensors is less than the temperature of the air detected by the temperature sensor configured to detect the temperature of the air blown by the fan by more than a predetermined temperature difference.

4. The cooling device according to claim 2, further comprising a humidity sensor configured to detect a humidity of the air blown by the fan onto the plurality of exothermic members,
    wherein the controller is configured to determine whether the apparatus is in the first state or the second based on the temperature detected by the temperature sensor configured to detect the temperature of the air blown by the fan, the humidity detected by the humidity sensor, and the temperatures of the plurality of exothermic members detected by the first plurality of temperature sensors.

5. The cooling device according to claim 4, wherein the controller is configured to specify a dew point from the temperature detected by the temperature sensor configured to detect the temperature of the air blown by the fan, and the humidity detected by the humidity sensor, and determine whether the apparatus is in the first state or the second state based on the specified dew point, and the temperatures of the plurality of exothermic members detected by the first plurality of temperature sensors.

6. The cooling device according to claim 1, wherein the thermoelectric element is configured to utilize the Peltier effect or the Thomson effect.

7. The cooling device according to claim 1, wherein the controller is configured to predict the temperatures of the plurality of exothermic members after an elapse of a fixed time from time series changes of the detection result obtained by the first plurality of temperature sensors, and
    wherein the controller is configured to determine whether the apparatus is in the first state or the second state based on the temperatures of the exothermic members predicted by the controller after an elapse of the fixed time in place of the detection result obtained by the first plurality of temperature sensors.

8. A cooling control method for use in an apparatus including a plurality of exothermic members, a plurality of thermoelectric elements or a plurality of absorption-type refrigerators provided for the exothermic members, a fan having a capability of cooling the plurality of exothermic members by blowing air onto the plurality of exothermic members, a plurality of temperature sensors to detect a temperature of each of the plurality of exothermic members, and a controller that controls the cooling device, the method comprising:
    executing, by the controller, a determination process of determining whether the apparatus is in a first state that does not cause condensation, or in a second state that causes condensation, based on a lowest temperature among the temperatures detected by the plurality of temperature sensors; and executing, by the controller, a cooling control process of decreasing the cooling capability of the plurality of thermoelectric elements or the plurality of absorption-type refrigerators, and increasing the cooling capability of the fan, when it is determined in the determination process that the apparatus is in the second state that causes condensation; and executing, by the controller, a cooling control process of increasing the cooling capability of the plurality of thermoelectric elements or the plurality of absorption-type refrigerators, and decreasing the cooling capability of the fan, when it is determined that the apparatus is in the first state that does not cause condensation.

9. A non transitory computer readable storage medium having a program stored thereon for controlling a computer incorporated in an apparatus including a plurality of exothermic members, a plurality of thermoelectric elements or a plurality of absorption-type refrigerators provided for the exothermic members a fan having a capability of cooling the plurality of exothermic members by blowing air onto the plurality of exothermic members, and a plurality of temperature sensors to detect a temperature of each of the plurality of exothermic members, the program causing the computer to perform functions comprising:

determining whether or not the apparatus is in a first state that does not cause condensation, or in a second state that causes condensation, based on a lowest temperature among the temperatures detected by the plurality of temperature sensors; and decreasing the cooling capability of the plurality of thermoelectric elements or the plurality of absorption-type refrigerators, and increasing the cooling capability of the fan, when it is determined that the apparatus is in the second state that causes condensation; and increasing the cooling capability of the plurality of thermoelectric elements or the plurality of absorption-type refrigerators, and decreasing the cooling capability of the fan, when it is determined that the apparatus is in the first state that does not cause condensation.

* * * * *

UNITED STATES PATENT AND TRADEMARK OFFICE
CERTIFICATE OF CORRECTION

PATENT NO.       : 9,305,857 B2
APPLICATION NO.  : 13/362306
DATED            : April 5, 2016
INVENTOR(S)      : Kazuyasu Fukano It is certified that error appears in the above-identified patent and that said Letters Patent is hereby corrected as shown below:

In the claims,

Column 9, line 42, change "members" to --members,--.

Column 10, line 31, after "the" delete "first".

Column 11, line 22, change "members" to --members,--.

Signed and Sealed this
Fifth Day of July, 2016

Michelle K. Lee
*Director of the United States Patent and Trademark Office*